(12) United States Patent
Snider

(10) Patent No.: US 6,952,358 B2
(45) Date of Patent: Oct. 4, 2005

(54) MOLECULAR WIRE CONTENT ADDRESSABLE MEMORY

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 74 days.

(21) Appl. No.: 10/429,421

(22) Filed: May 5, 2003

(65) Prior Publication Data

US 2004/0223352 A1 Nov. 11, 2004

(51) Int. Cl.$^7$ ................................................ G11C 15/00
(52) U.S. Cl. ..................... 365/49; 977/DIG. 1; 711/108
(58) Field of Search ............................. 365/49; 711/108; 977/DIG. 1

(56) References Cited

U.S. PATENT DOCUMENTS 5,469,378 A * 11/1995 Albon et al. ................... 365/49
6,128,214 A * 10/2000 Kuekes et al. ............... 365/151
6,256,767 B1 * 7/2001 Kuekes et al. ................... 716/9
6,314,019 B1 * 11/2001 Kuekes et al. ............... 365/151
6,559,468 B1 * 5/2003 Kuekes et al. ................. 257/14

* cited by examiner

Primary Examiner—Anh Phung
Assistant Examiner—J. H. Hur

(57) ABSTRACT

In one embodiment, a content addressable memory (CAM), includes: a word line driver configured to provide a driving signal; a tag memory including M word lines traversing through the tag memory and intersecting with 2N bit lines, where M and N are each suitable integer values, where each word line and each bit line is a single molecular wire; a search enable circuitry coupled to the word line driver and configured to allow the driving signal to be driven onto a subset of the word lines in the tag memory; and a match detection circuit coupled to the tag memory and configured to detect current flow on the horizontal word lines.

21 Claims, 14 Drawing Sheets

BLOCK DIAGRAM OF MOLECULAR WIRE CAM

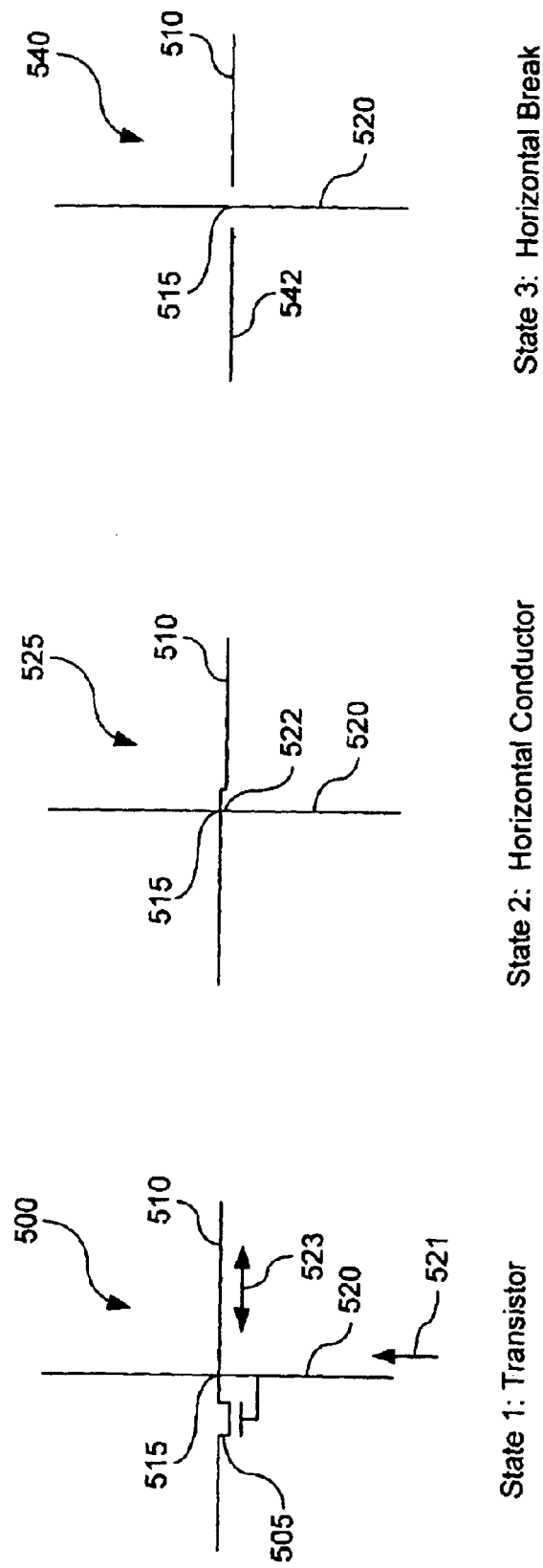

CONVENTIONAL MEMORY

CONTENT ADDRESSABLE MEMORY (CAM)

BLOCK DIAGRAM OF MOLECULAR WIRE CAM

Representing a small memory using the molecular wire CAM scheme using all four encodings: "0", "1", "X" and "U".

Alternate representation of a small memory using the molecular wire CAM scheme using only three encodings: "0", "1" and "X."

Pattern driver configured to search for the pattern "1X0"

MOLECULAR WIRE CONTENT ADDRESSABLE MEMORY

TECHNICAL FIELD

Embodiments of the present invention relate generally to content addressable memory (CAM) devices.

BACKGROUND

Recently issued and commonly assigned U.S. Pat. No. 6,128,214 to Philip J. Kuekes, et al., entitled "Molecular Wire Crossbar Memory, which is hereby fully incorporated herein by reference, discloses methods for creating extremely dense, molecular scale crossbar memories. The crossbar memory is built out of two planes of nanoscale wires, with the wires in a first plane parallel to wires in the second plane, and chemically self-assembled to form a dense fabric. As shown in FIG. 1, the plane 105 is formed by the wires 115, while the plane 110 is formed by the wires 116. The two planes (105, 110) of wires are placed one atop the other plane, separated by a small gap filled with a chemical species (such as, for example, rotaxane "R" as sketched in FIG. 3).

The wires in the two planes (105, 110) have a non-zero angle with respect to each other. Typically, the wires in one plane would be approximately orthogonal to the wires in the other plane. The chemical in the separating layer, along with the composition and coatings of the wires, allow for the creation of various types of electrical components formed at the junction 205 of the two wires in the different planes (105, 110) as shown in FIG. 2. For example, the junction 205 of two wires (115, 116) in different planes, along with one or more molecules (such as rotaxane which is labeled "R" in the drawings) in the chemical layer 305 separating the planes (105, 110), can form a programmable switch component in the region of the junction 205. Various types of components can be fabricated depending on the chemical properties of the wires (115, 116) and the chemical layer 305. For example, a crossbar network 403 (FIG. 4) of programmable diodes 405 can be chemically synthesized, where a diode 405 can be programmed to be present (thus allowing current to flow in one direction between the horizontal wire 116 and vertical wire 115 that the diode 405 connects) or can be programmed to be missing (thus providing no connection between the wires 115 and 116). Other functionalities that can be achieved are also detailed in the above-mentioned U.S. Pat. No. 6,128,214.

The above current approaches and/or technologies are suited for their intended purpose, but are limited to particular capabilities and/or suffer from various constraints. There is a continuing need to develop memory technology that provides enhanced performance.

SUMMARY OF EMBODIMENTS OF THE INVENTION

In one embodiment of the invention, a content addressable memory (CAM) includes: a word line driver configured to provide a driving signal; a tag memory including M word lines traversing through the tag memory and intersecting with 2N bit lines, where M and N are each suitable integer values, where each word line and each bit line comprises a single molecular wire; a search enable circuitry coupled to the word line driver and configured to allow the driving signal to be driven onto a subset of the word lines in the tag memory; and a match detection circuit coupled to the tag memory and configured to detect current flow on the horizontal word lines.

In another embodiment of the invention, a method of searching a content addressable memory (CAM) includes: loading a target pattern into a pattern driver; searching up to one half of an address space of the CAM; and if the target pattern is not in the one half of the address space, then searching up to one half of the remaining addresses in the address space of the CAM.

These and other features of an embodiment of the present invention will be readily apparent to persons of ordinary skill in the art upon reading the entirety of this disclosure, which includes the accompanying drawings and claims.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 5 are block diagrams illustrating an example transistor that can be configured at a junction of two crossed molecular wires, where the transistor can be configured to be in one of three states, where the states can be used in an embodiment of the invention.

DETAILED DESCRIPTION OF PREFERRED EMBODIMENTS

Figure 1:
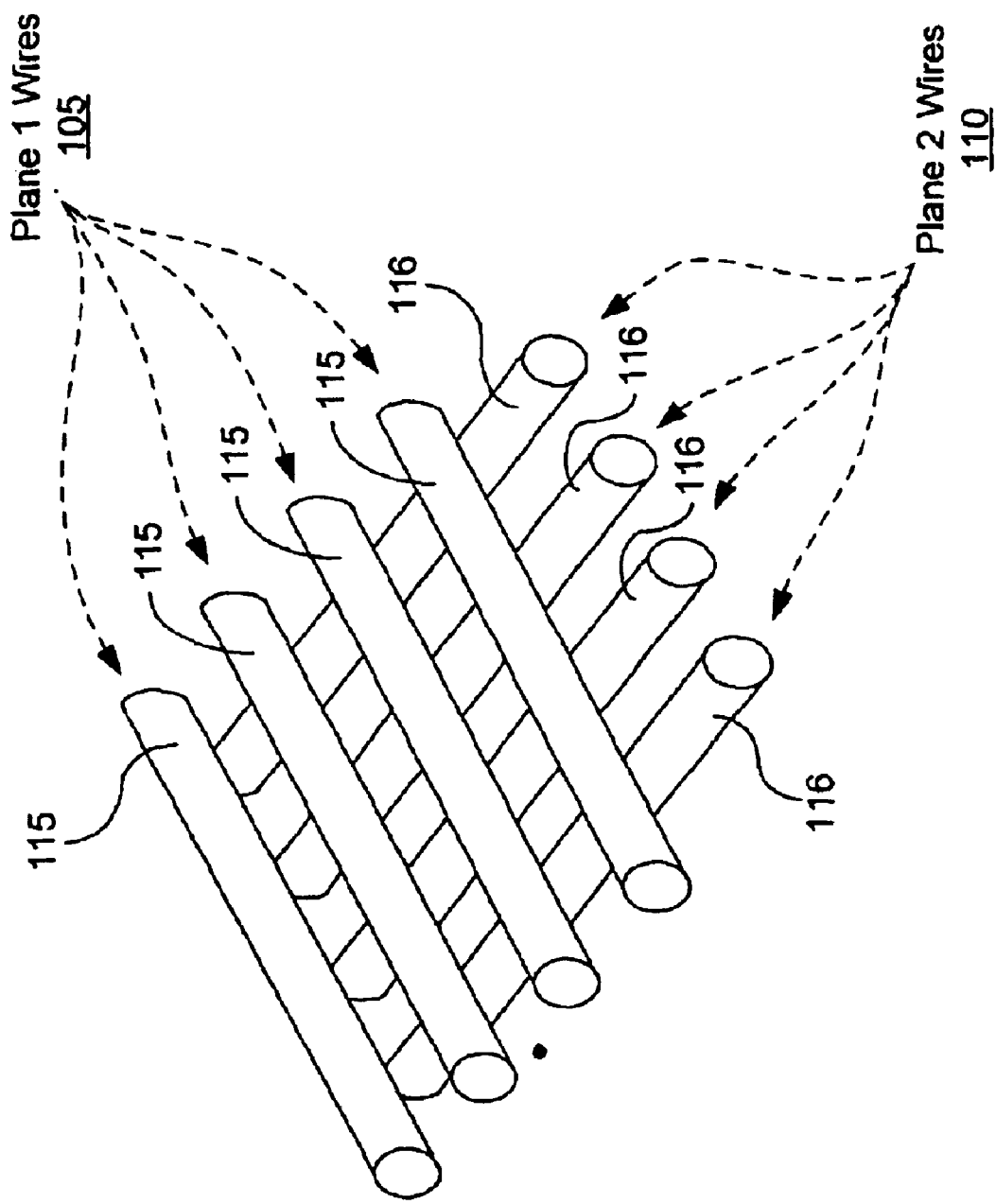
FIG. 1 is a block diagram illustrating two planes of molecular wires, where the planes are separated by a small gap filled with a chemical species such as, for example, rotaxane.
Figure 2:
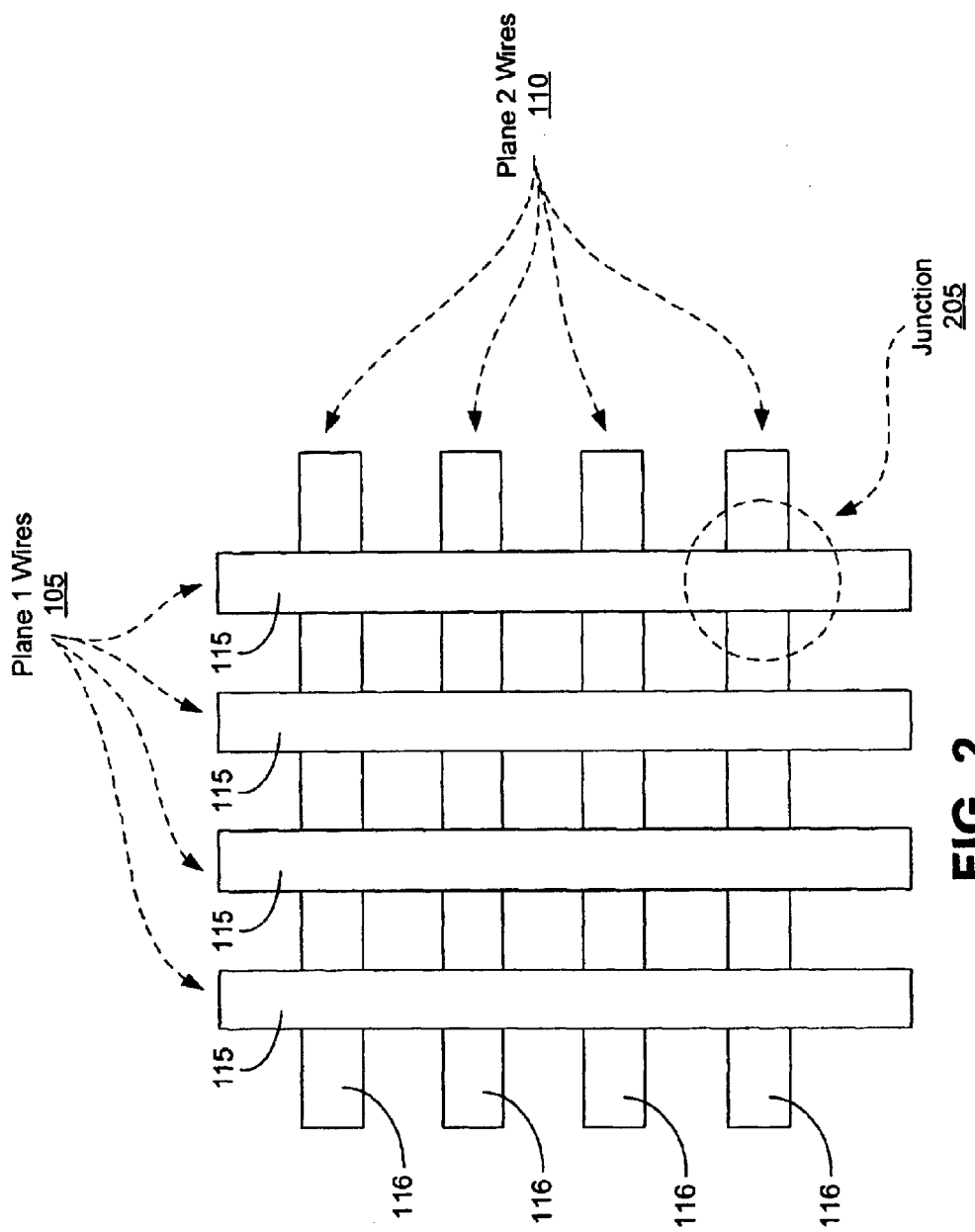
FIG. 2 is a block diagram of another view of the two places of molecular wires, where the diagram shows the approximate orthogonality of the wires in the two planes.
Figure 4:
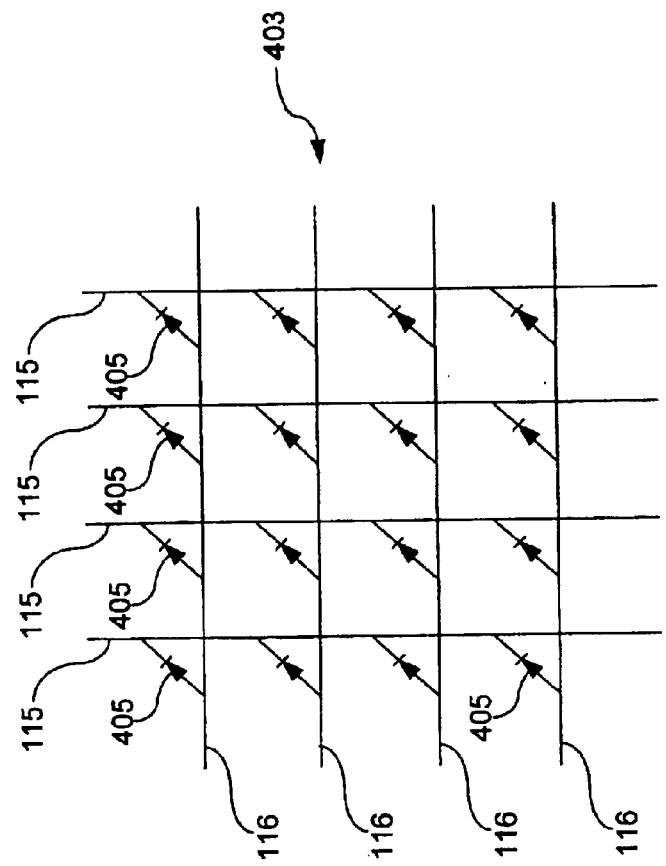
FIG. 4 is a block diagram showing the junctions between the molecular wire planes, where diodes or other electrical components such as resistors or transistors are formed at each junction.
Figure 3:
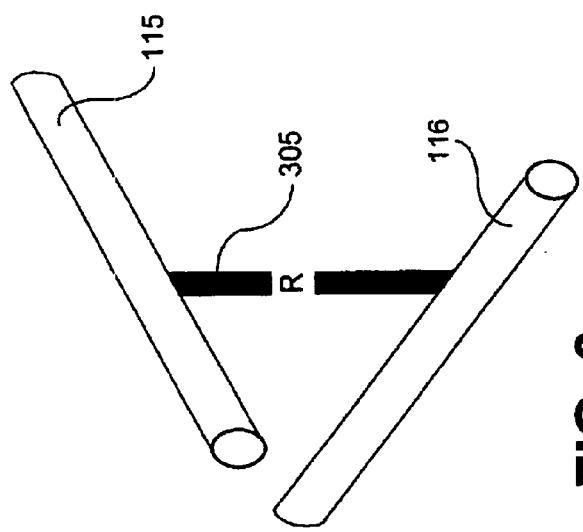
FIG. 3 is a block diagram illustrating one or more molecules (such as rotaxane) formed at the junction between two wires in different planes, where the molecule is bonded to each wire and forms an electrical component.

In the description herein, numerous specific details are provided, such as examples of components and/or methods, to provide a thorough understanding of embodiments of the invention. One skilled in the relevant art will recognize, however, that an embodiment of the invention can be practiced without one or more of the specific details, or with other apparatus, systems, methods, components, materials, parts, and/or the like. In other instances, well-known structures, materials, or operations are not shown or described in detail to avoid obscuring aspects of embodiments the invention.

Embodiments of the invention utilize a special type of transistor at each junction 205. Commonly-assigned U.S. Pat. No. 6,256,767 to Philip J. Kuekes, et al., entitled "Demultiplexer for a Molecular Wire Crossbar Network (MWCN DEMUX)", which is hereby fully incorporated herein by reference, describes a process for making this type of transistor.

Referring now to FIG. 5, one embodiment of the invention utilize transistors 505 in order to provide a unique kind of memory that allows the transistor to be configured (and reconfigured) at the junction of two crossed molecular wires. The transistor 505 is typically of the type as described in the above-referenced U.S. Pat. No. 6,256,767. The transistor 505 can be configured (or reconfigured) into one of three different states as shown in FIG. 5. In the first state 500 (FIG. 5, state 1), the transistor 505 acts much like a field effect transistor (FET) with the source and drain formed by a horizontal wire 510 near the junction 515 of a vertical wire 520 which is coupled to the gate of transistor 505. When the voltage 521 on the vertical wire 520 is set to one level (denoted as "LO"), then the transistor 505 formed at the junction 515 is put into a high impedance state, effectively blocking current flow in the horizontal wire 510 through the junction 515. When the voltage 521 is set to another level (denoted as "HI"), then the transistor 505 is put into a lower impedance state, effectively allowing current 523 to flow in the horizontal wire 510 in either direction. Typically, the "HI" level is a high logic voltage level that turns on the transistor 505 and the "LO" level is a low logic voltage level that turns off the transistor 505.

In the second state 525 (FIG. 5, state 2), the horizontal wire 510 is put into a low impedance state in the junction 515, regardless of whether the voltage 521 on the vertical wire 520 is at the "LO" level or "HI" level. Thus, the second state 525 effectively forms a horizontal conductor 522.

In the third state 540 (FIG. 5, state 3), the horizontal wire 510 is put into a high impedance state 542, effectively breaking the wire 510 at the junction 515, regardless of whether the voltage 521 on the vertical wire 520 in that junction 515 is at the "LO" level or "HI" vlevel.

An embodiment of the invention makes use of state 1 (500), state 2 (525), and optionally, state 3 (540) of FIG. 5, as described in additional details below.

Content Addressable Memory (CAM)

Figure 6:
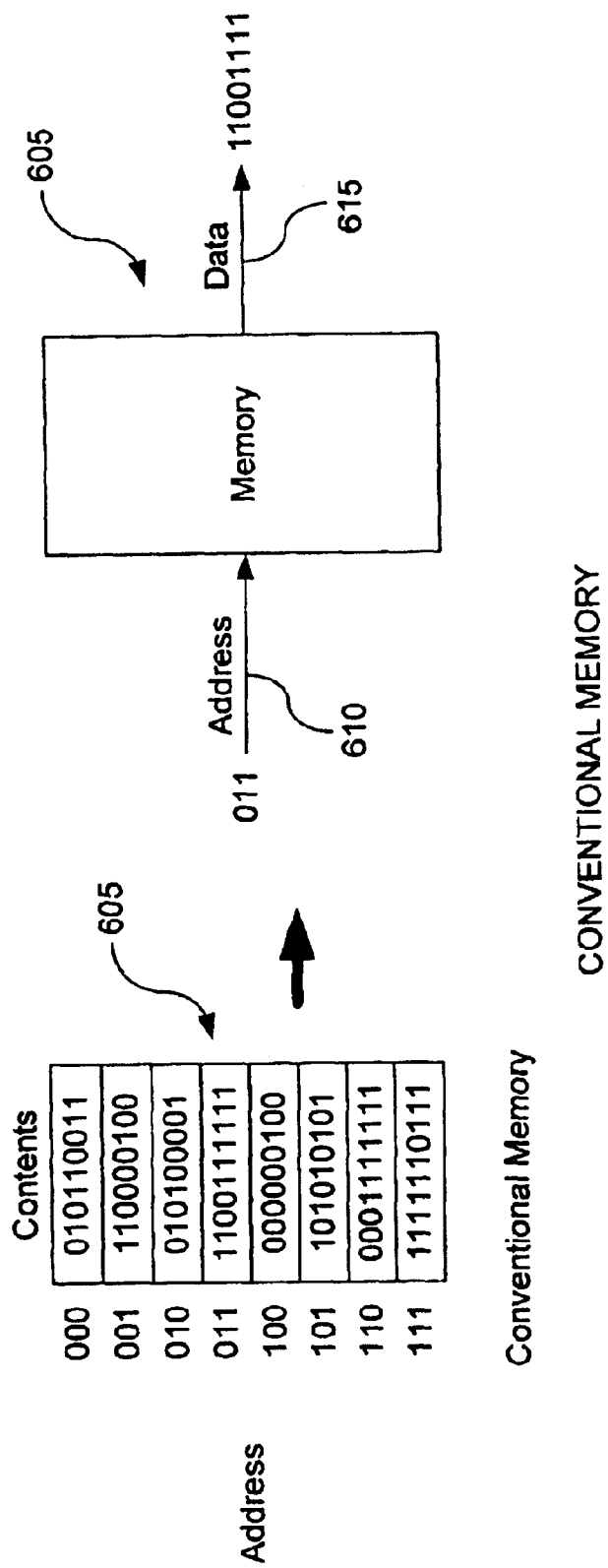
FIG. 6 is a block diagram illustrating a conventional memory.

A content addressable memory (CAM) is a memory that provides a mechanism for fast searching of the memory contents. Instead of answering the question "what is the content of the memory at this address?" as provided by an ordinary conventional memory 605 (FIG. 6), a CAM 705 (FIG. 7) allows one to quickly answer the question "which address or addresses (if any) contain this pattern?".

Figure 7:
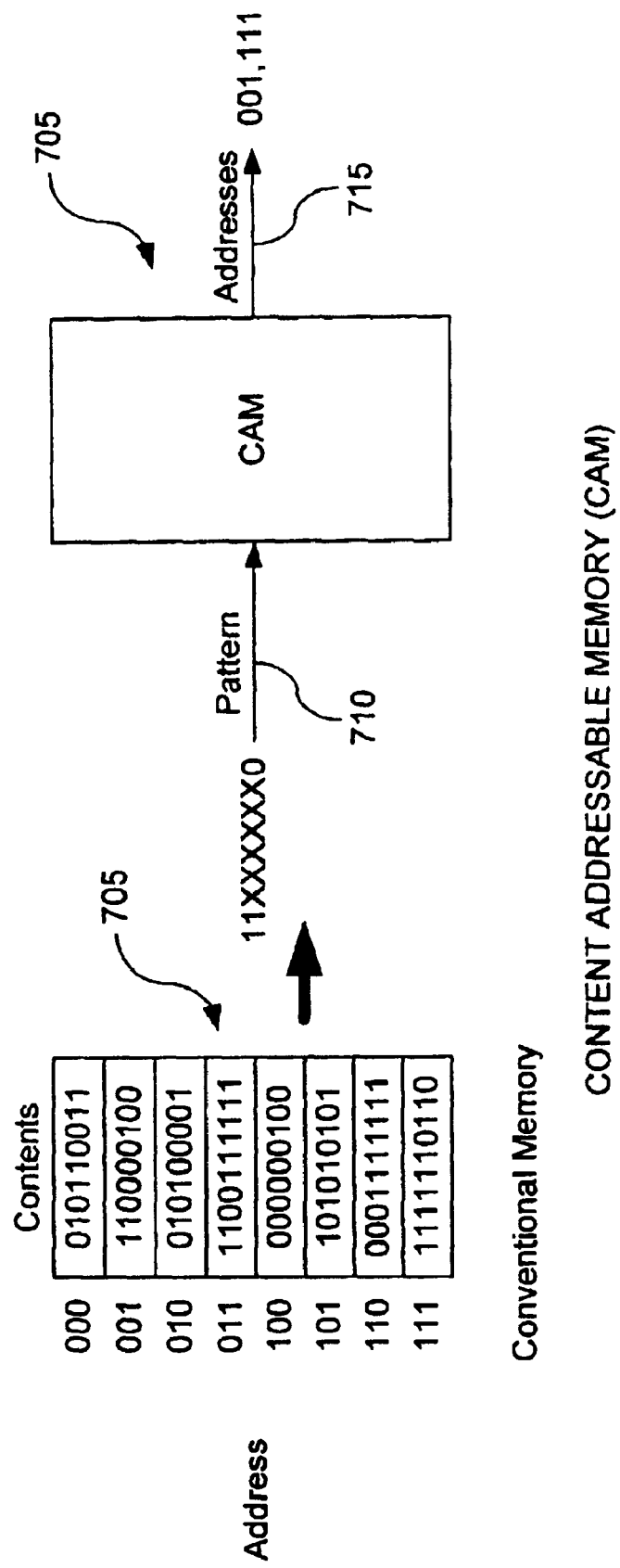
FIG. 7 is a block diagram illustrating a content addressable memory (CAM) that can implement an embodiment of the invention.

Thus, in the conventional memory 605, if an address 610 (e.g., address "011") is queried, then the data 615 output will be the value "11001111" which is stored in address "011". In contrast, the pattern 710 that is used to address the CAM 705 comprises a string of "1"s, "0"s, and "don't care's (shown in FIG. 7 as an "X" bit), where the string has the same bit width as the entries in the CAM 705. When matching the pattern with each entry in the CAM 705, a "1" bit in the pattern can only match with a "1" in the corresponding bit position in each entry in the CAM 705. A "0" in the pattern can only match with a "0" in the corresponding bit position in each entry in the CAM 705. A "don't care" ("X") bit in the pattern can match either a "1" or a "0" in the corresponding bit position in each entry in the CAM 705. Conceptually, all entries in the CAM 705 are compared with the pattern 710 concurrently, with the result being a list of addresses 715 (or one address) whose contents match the pattern 710. The list of addresses 715 will be empty if no CAM 705 entry matches the pattern 710. As a practical matter, it is only necessary that the CAM 705 produces its result much faster than can be produced with a conventional memory 605, which would require examining and comparing the contents of each memory 605 location sequentially. In the example of FIG. 7, when pattern 710 containing the bits "11XXXXXX0" is used to query the CAM 705, then the output 715 will list the address "001" and "111" in the CAM 706.

CAMs 705 are often used as building blocks for creating associative memories, such as caches and have many applications in pattern matching and searching.

An embodiment of the invention provides small, dense CAMs using molecular wire technology. A CAM with M addresses can be searched in O(log M) time depending on entries that match the input pattern. As known to those skilled in the art, the running time of a binary search is proportional to log n and this is commonly known as an O(log n) algorithm.

Figure 8:
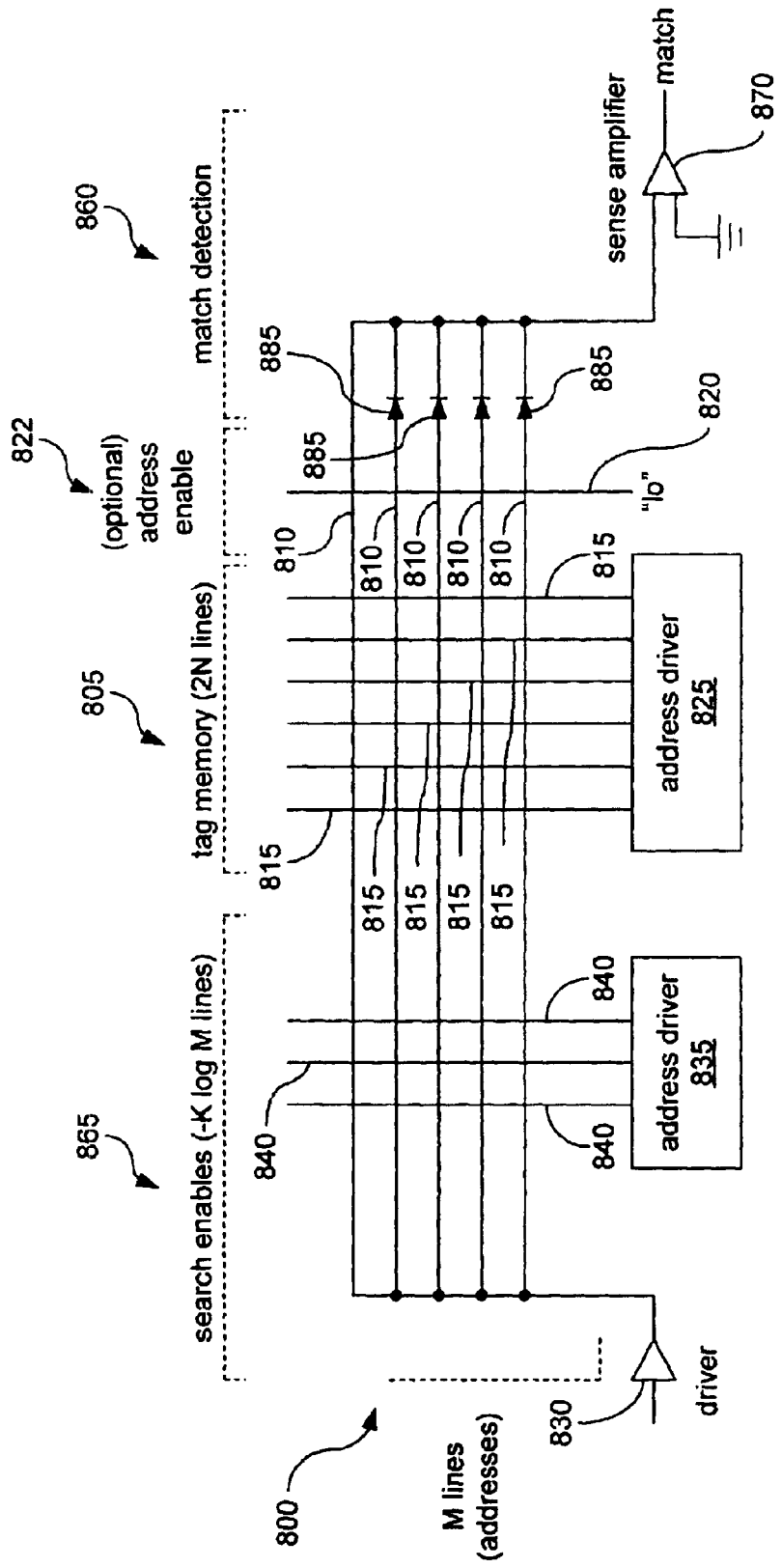
FIG. 8 is a block diagram of a molecular wire CAM, in accordance with an embodiment of the invention.

A high-level block diagram of a molecular wire CAM 800 in accordance with an embodiment of the invention is shown in FIG. 8. The functionalities of various components of the molecular wire CAM 800 in FIG. 8 are described below.

Tag Memory

The tag memory 805 in FIG. 8 typically consumes the vast bulk of the area of the CAM 800 and comprises M word lines (addresses) 810 intersecting 2N bit lines 815, where M and N are each suitable integer values. This M×2N array of lines form an M×N memory bank 817. Each word line 810, typically implemented with a single molecular wire, corresponds to a single address in the memory 805.

Figure 9:
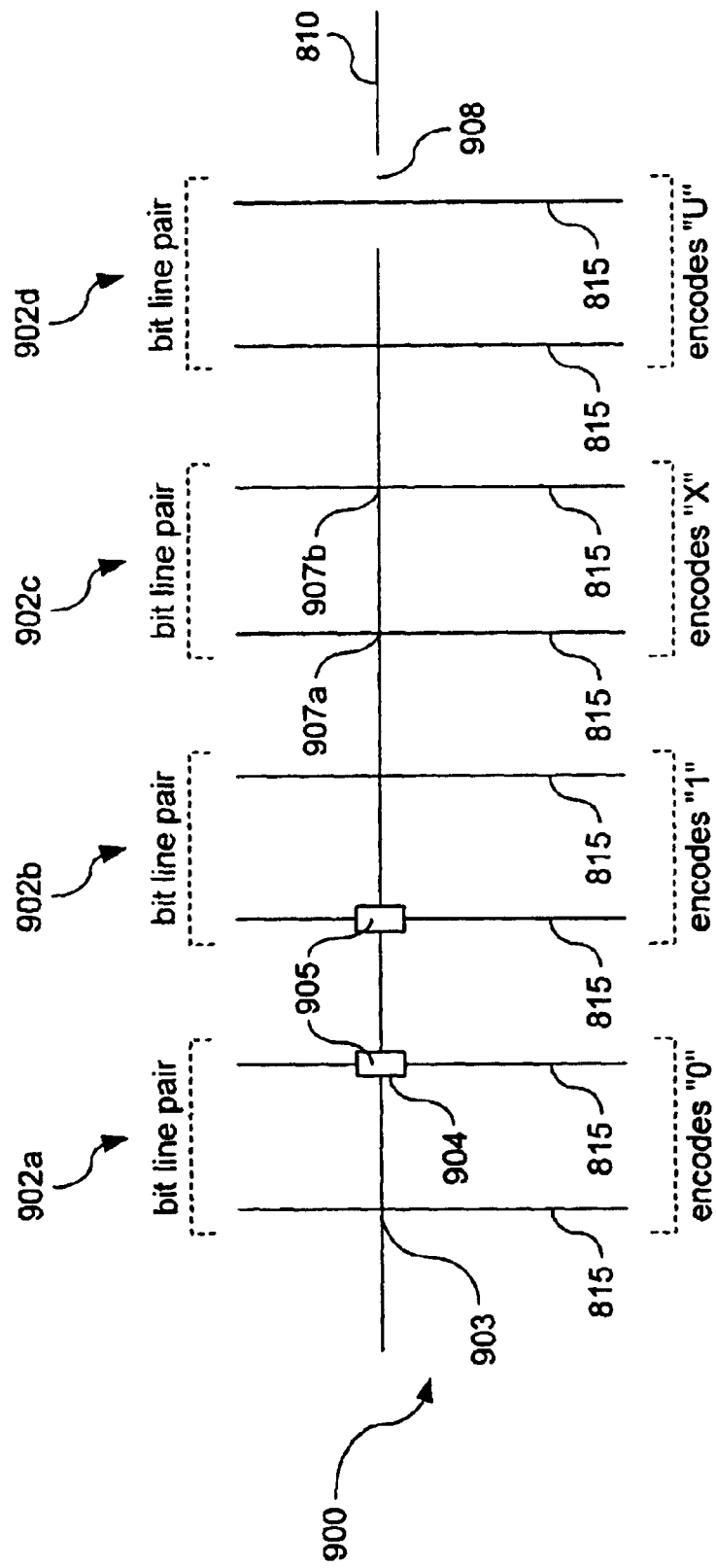
FIG. 9 is a block diagram of four bits in a memory bank showing an encoding scheme, in accordance with an embodiment of the invention.

The different encoding states of a single bit in the memory bank are shown in FIG. 9. Four (4) bits in the memory bank portion 900 (in memory bank 817) show the encoding scheme, as an example. Two junctions (e.g., junctions 903, 904) are used to represent each bit. A block 905 represents a transistor (such as a transistor 505 from FIG. 5, state 1) that enables conduction through the horizontal molecular wire 810 when its vertical wire 815 is at the "HI" level, and "breaks" (i.e., prevents conduction across) the horizontal molecular wire 810 when its vertical wire 815 is at the "LO" level. The absence of a block 905 at a junction of wires 810 and 815 represents a horizontal conductive wire (FIG. 5, state 2), as in junctions 907a and 907b in bit line pair 902c. A break in a horizontal wire 810 at the junction of a vertical wire 815 represents a non-conductive "break" in the wire (FIG. 5, state 3), as in junction 908 in bit line pair 902d. The scheme in FIG. 9 can be used to encode the following bit values: "0" (bit line pair 902a in this example); "1" (bit line pair 902b in this example); "X" or "don't care" (bit line pair 902c in this example); and "U" or unused (bit line pair 902d in this example).

As similarly mentioned above, the block 905 in FIG. 9 represents a transistor 505 (or similar type of transistor) formed at the junction of a horizontal wire and vertical molecular wire, where the block 905 is configured to behave as a "state 1" FET transistor (FIG. 5). The lack of a block 905 at a junction of the wires denotes a "state 2" FET that is conductive. A break in a horizontal wire over the junction with a vertical wire denotes a "state 3" FET that is nonconductive. Note that two junctions are used to represent a single bit, and that these configurations allow for the encoding of the four different possible bit states of "0", "1", "X", and "U". The first three of these states require only the use of "state 1" and "state 2" FET transistors, while the last bit state requires a "state 3" FET transistor. If a "state 3" FET transistor cannot be provided by an implementation, then only the first three bit states ("0", "1", and "X" bit states) can by used and the "U" bit state is not used.

If the "U" bit state encoding is available, an unused address (memory location) is encoded by using the "U" encoding for at least one of the bit line 815 pairs on the word line 810 corresponding to the address. This is useful for representing partially populated memories. Initially, an empty CAM can be represented by having each word line 810 contain at least one bit line 815 pair configured in the "U" encoding. If the "U" encoding in not available, then unused addresses are marked using a different mechanism as described below.

Word values formed by binary bits can be stored as a word in the CAM 800 by using the "1" and "0" bit state encodings. For example, a word value of "1X0" represents a word where the first bit is a "1", the second bit (denoted by "X") is either a "1" or a "0", and the third bit is a "0". This effectively allows two or more data values differing in one or more bit positions to be stored in the same memory location in the CAM 800. This is useful in applications where the values of interest to be stored in the CAM 800 have varying widths. For example, a 5-bit wide CAM can be used to store values of any bit-width from one bit to five bits by using the "X" bits to fill in the unused bit positions in a stored value. Thus, the data values stored within the tag memory of a CAM 800 may include "don't care" bits, which provide a mechanism for storing variable width data in a fixed width CAM.

Figure 10:
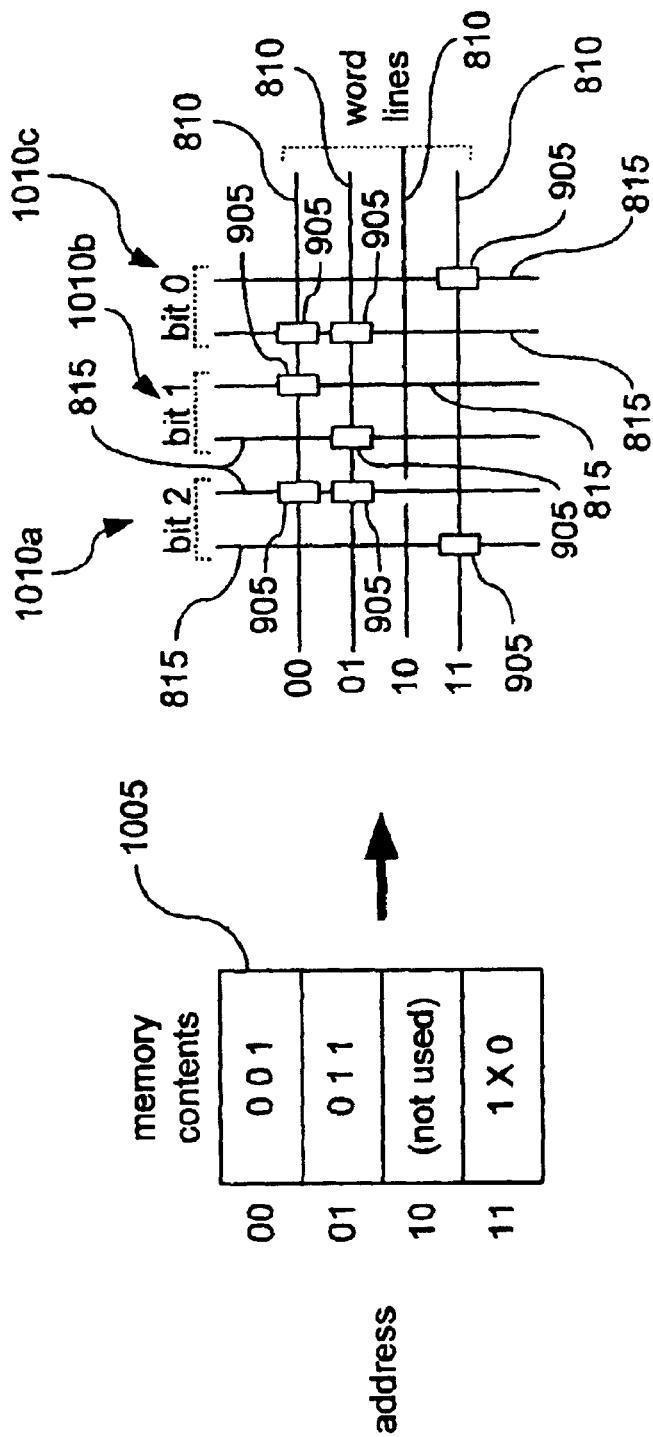
FIG. 10 is a block diagram representing a small memory that use the molecular wire CAM scheme with four encodings of "0", "1", "X", and "U", in accordance with an embodiment of the invention.

FIG. 10 is a block diagram representing a small memory using the above-mentioned molecular wire CAM scheme that use the four encodings, "0", "1", "X" and "U", in accordance with an embodiment of the invention. The figure illustrates the encoding of a four word, three bit wide CAM 1005 and using molecular wires 810 and 815. Locations (addresses) "00" and "01" hold 3-bit wide values encoded using the "0" and "1" encodings from FIG. 9. Location "10" is an unused memory address, representing the "U" encoding in the bit positions. Location "11" shows how a 2-bit wide value can be stored in a 3-bit wide CAM 1005 by using the "X" encoding for the unused bit. For location "11", bit 2 (1010a) encodes "1", bit 1 ((1010b) encodes "X", and bit 0 (1010c) encodes "0".

Address Enable

Figure 11:
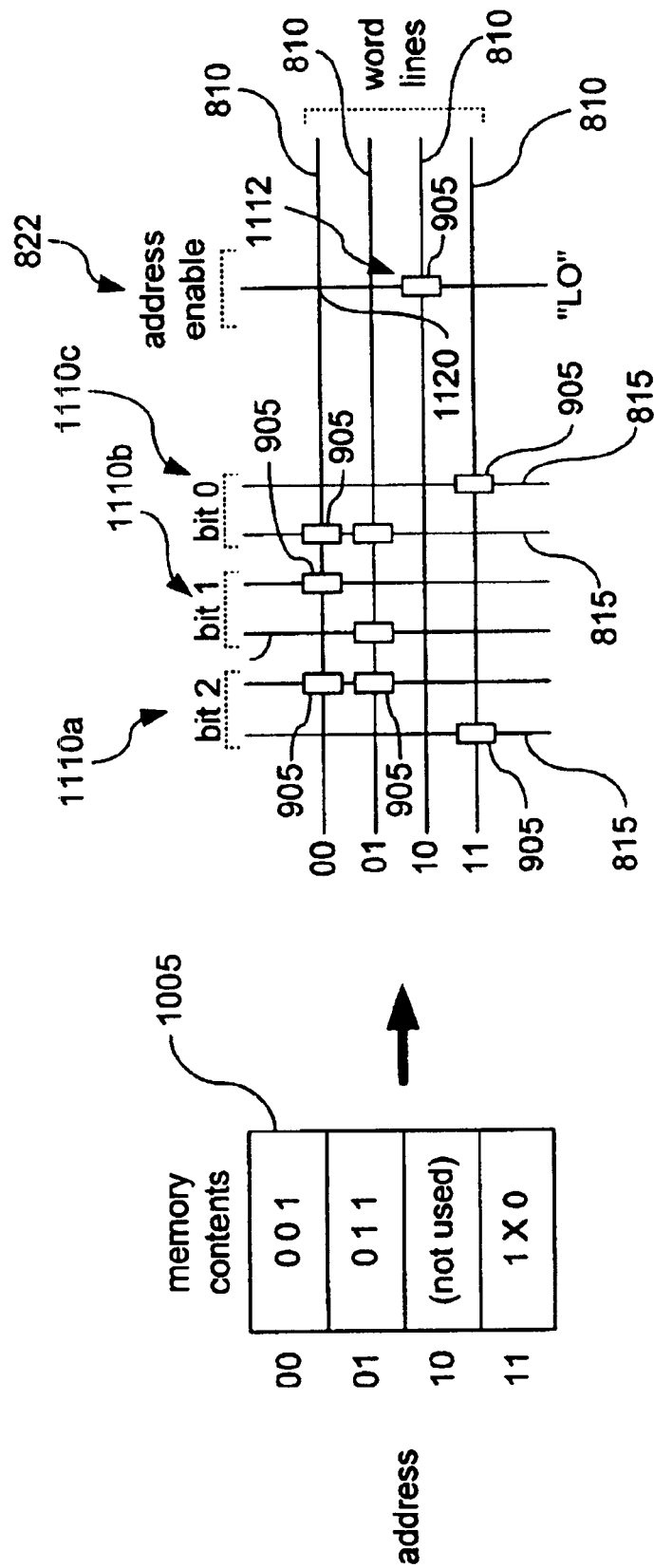
FIG. 11 is a block diagram representing an alternate representation of a small memory that use the molecular wire CAM scheme with three encodings of "0", "1", and "X", in accordance with an embodiment of the invention.

If a given implementation of molecular wires can only provide "state 1" and "state 2" FETs, the "U" encoding is not possible and then an embodiment of the invention provides an alternative scheme to represent the unused locations in the CAM. FIG. 11 illustrates an alternate representation of a small memory 1105 using the molecular wire CAM scheme using only three encodings, "0", "1", and "X", in accordance with an embodiment of the invention. Bit 2, bit 1, and bit 0 are shown as 1110a, 1110b, and 110c, respectively. In this case, an additional vertical molecular wire 820, shown as the "address enable" section in FIGS. 8 and 11, crosses the horizontal wires 810 and is driven with a "LO" voltage. For unused words in the CAM 1105, the junction 1112 of the word line 810 with the "address enable" vertical wire 820 is configured to be a "state 1" transistor (see FIG. 5). Used words are configured with a "state 2" conductor (see FIG. 5). Since the "address enable" wire 820 is driven by the "LO" voltage, all configured unused word line 810 can never be conductive, regardless of the state of the bits in the tag memory 805. This prevents unused word lines 810 from providing false matches when examining the memory 1105 for patterns.

Note that if the "U" encoding is available, however, then the "address enable" vertical wire 820 is not typically needed. For purposes of simplicity and to better explain functionalities of embodiments of the invention, the remainder of the discussion below will assume that the "U" encoding is available, but it should be noted that the circuitry outside of the tag memory 805 does not depend on the "U" encoding, and embodiments of the invention can be implemented without the "U" encoding.

Pattern Driver

Figure 12:
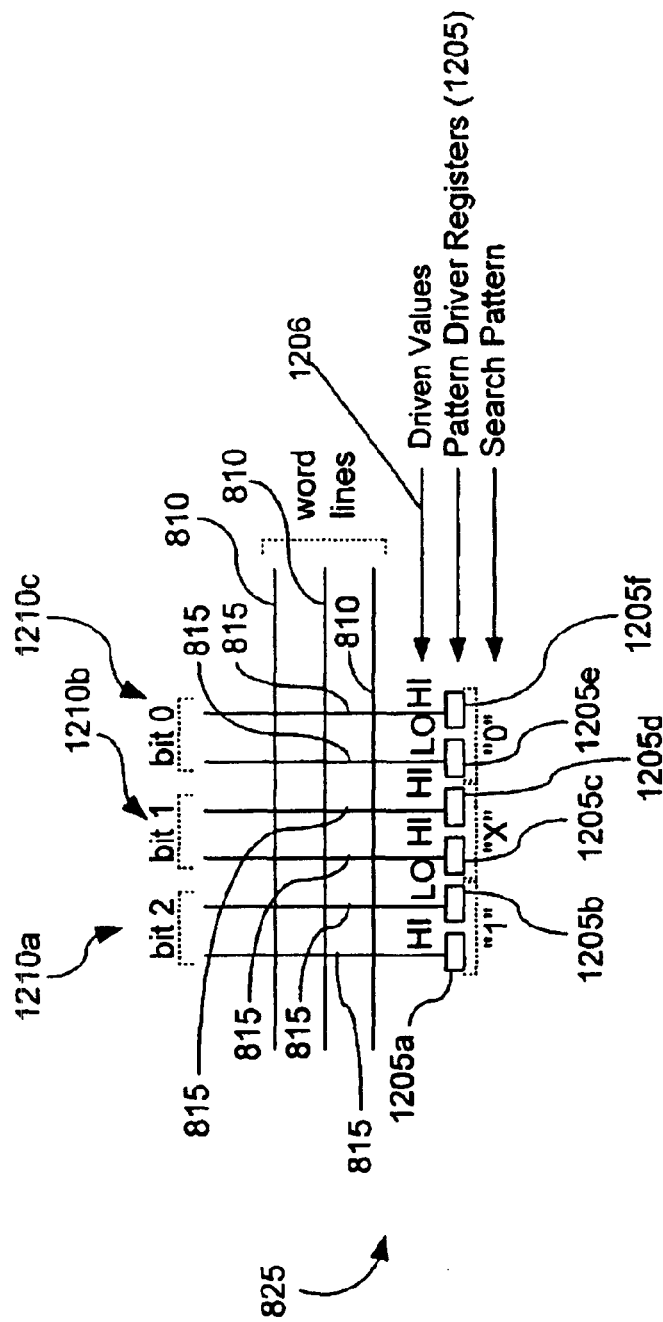
FIG. 12 is a block diagram of an embodiment of a pattern driver configured to search for an example pattern "1X0".

In an embodiment, the pattern driver 825 in FIG. 8 is a multibit register driving vertical lines 815 through the tag memory 805 with the desired pattern to be searched in the CAM (e.g., CAM 800 or CAM 1105 in FIG. 11). The pattern driver 825 typically uses 2-bit registers (shown generally as 1205 in FIG. 12) for each bit in the desired pattern. The desired pattern to be searched for is loaded into these registers 1205 prior to the search of the pattern. FIG. 12 illustrates an embodiment of the pattern driver 825 loaded with an example search pattern "1X0". Bit 2, bit 1, and bit 0 are shown as 1210a, 1210b, and 1210c, respectively.

In the example of FIG. 12, registers 1205 are formed by registers 1205a to 1205e. Each register 1205 drives either a "HI" or "LO" signal (i.e., driven values 1206) onto its associated vertical line 815, causing any and all configured transistors 905 (not shown in FIG. 12) at a junction of lines 810 and 815 to be either enabled or disabled. Each pair of registers 1205 taken together forms one bit of the search pattern using the encoding in Table 1, below. Note the correspondence between this encoding and the memory bit encoding shown in FIG. 9.

TABLE 1

Encoding of pattern driver registers 1205

| Pattern | Register pair output values (1206) |
|---|---|
| "0" | LO, HI |
| "1" | HI, LO |
| "X" | HI, HI |

Search Enables and Address Driver

Figure 13:
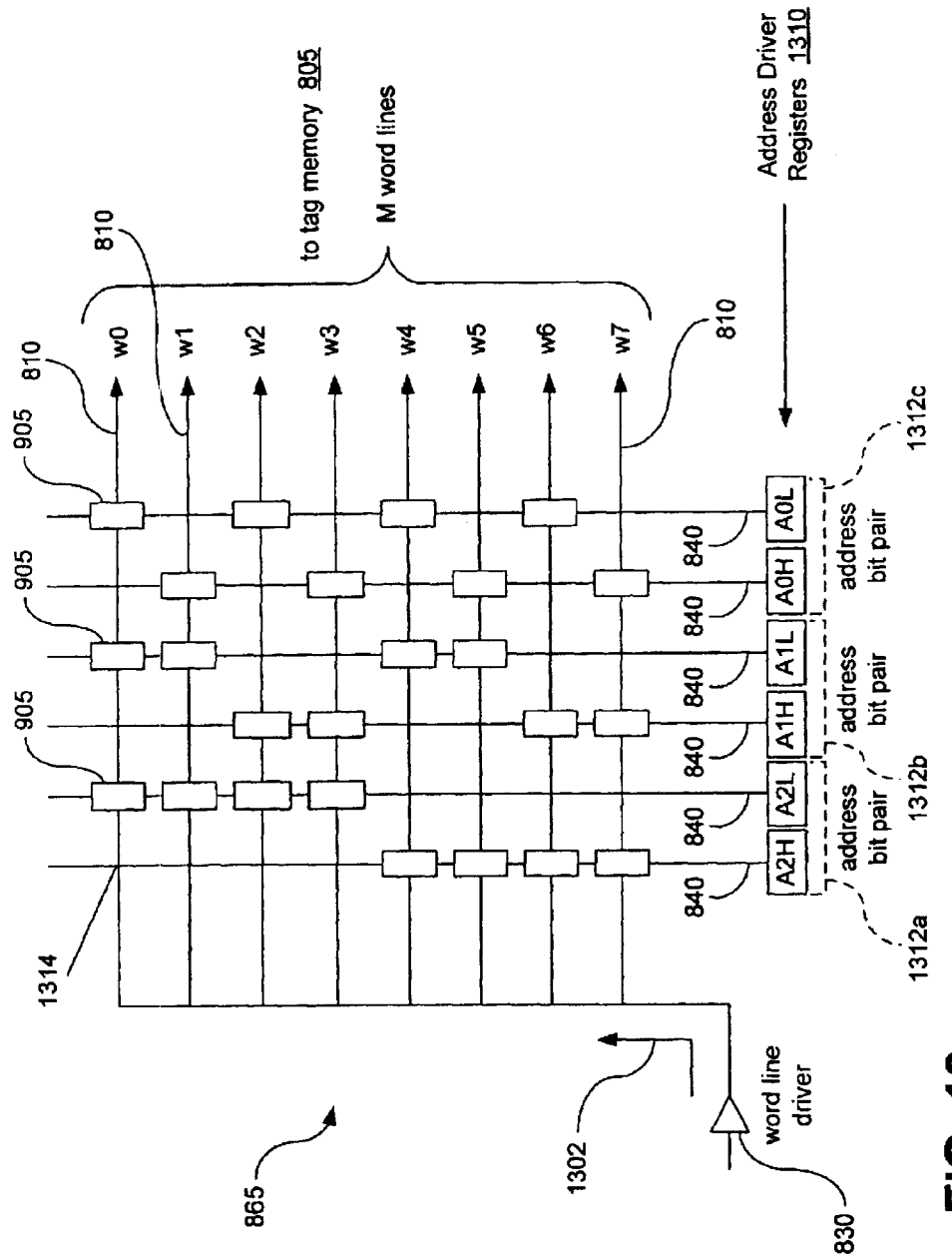
FIG. 13 is a block diagram of an embodiment of an address driver circuitry.

Reference is now made to FIG. 13. The search enable section 865 of an embodiment of this invention allows a driving signal 1302 (driven by the word line driver 830 in FIG. 8) to be driven onto a subset of the horizontal word lines 810 of the tag memory 805, depending on values held in the address driver registers 1310. One compact way of implementing this search enable section 865 is shown in the block diagram of FIG. 13.

In this approach, 2 ⌈log₂ M⌉ vertical lines 840 and the same number of driver registers 1310 (one register per line 840) are needed to form the search enable section 865. A function expressed as ⌈x⌉ is known as a "ceiling function," which rounds up to the next largest integer if the value of the function is not already an integer. For example, ⌈1.2⌉=2 and ⌈3⌉=3.

In this current example, M (the number of word lines 810 in the CAM) is equal to eight (8), so that 2 ⌈log₂ 8⌉=8 vertical lines 840 are needed. In this example, the word lines 810 are also specifically labeled as w0, w1, . . . w7. The vertical lines 840 are grouped into pairs with each vertical line pair representing one bit of the CAM address space (see address bit pairs 1312a, 1212b, and 1312c). Transistors 905 are configured at particular junctions 1314 of the vertical address lines 840 and the horizontal word lines 810 in a pattern such that each word line 810 is configured to contain ⌈log₂ M⌉ transistors 905 and each vertical address line 840 is configured to contain ⌈M/2⌉ transistors 905. In the example of FIG. 13, there will be ⌈M/2⌉=⌈8/2⌉=4 transistors per vertical address line 840. Such a pattern allows each single word line (w0 through w7) to be driven by setting an appropriate value in each of the address driver registers 1310, as well as multiple word lines 810 if desired. For example, if address driver registers A2L, A1L, and A0L all drive the "HI" level while the remaining registers A2H, A1H, A0H drive the "LO" level, then the three transistors 905 on the word line w0 will all be put into a low impedance state, allowing the current to flow from the word line driver 830 on the left side of search enable section 865 to the word line w0 on the right side. None of the other word lines would be driven in this configuration. As a second example, if the address driver registers A2L drives the "LO" level and all of the other driver registers drive the "HI" level, then the word lines w4, w5, w6, and w7 would be driven by the word line driver 830, while the other word lines would not be driven by the driver 830.

For convenience, the state of the address driver registers 1310 can be encoded using the scheme shown below in Table 2, which is essentially the same scheme used by the pattern driver registers 1205 (shown in Table 1).

TABLE 2

Encoding of address driver registers 1310

| Pattern | Register pair output values (e.g., for registers A2H, A2L) |
|---|---|
| "0" | LO, HI |
| "1" | HI, LO |
| "X" | HI, HI |

Using this convention, the following addresses shown in Table 3 stored in the address driver registers 1310 would permit the corresponding word lines to be driven in the example of FIG. 13. For example, in Table 3, the address "000" stored in the address driver registers 1310 would drive word line w0.

TABLE 3

Word lines driven for address register states for the example of FIG. 13.

| address | Driven word lines |
|---|---|
| 000 | w0 |
| 101 | w5 |

TABLE 3-continued

Word lines driven for address register states for the example of FIG. 13.

| address | Driven word lines |
|---|---|
| 1X0 | w4, w6 |
| XX1 | w1, w3, w5, w7 |
| X0X | w0, w1, w4, w5 |

Match Detection

The match detection circuitry 860 of FIG. 8 is used to detect current flow on one or more of the horizontal word wires 810 traversing through the tag memory 805. If none of the horizontal wires 810 is enabled by the search enable circuitry 865, the total amount of current (due to leakage) through the diodes 885 to the sense amplifier 870 will be insufficient to reach the threshold of the sense amplifier 870. The sense amplifier 870 will emit a "no match" output in this case. If, however, at least one of the horizontal lines 810 can conduct current from the word line driver 830, then the threshold of the sense amplifier 870 will be crossed and the sense amplifier will emit a "match" output.

Micron-scale Interfacing

The search enable circuitry 865 described in the previous above section assumes nanoscale wires are used throughout the CAM 800. Specifically, nanoscale wires are used for the word lines 810 and bit lines 815, in accordance with an embodiment of the invention. When a CAM is embedded within a larger molecular circuit, this assumption of using nanoscale wires is appropriate and provides the best density for the CAM. Commonly-assigned U.S. Pat. No. 6,314,019 to Philip J. Kuekes, et al., entitled "Molecular-Wire Crossbar Interconnect (MWCI) For Signal Routing and Communications", which is hereby fully incorporated herein by reference, describes a method for configuring molecular wires to implement such larger molecular circuitry. Commonly-assigned U.S. Pat. No. 6,314,019 discloses a molecular-wire crossbar interconnect for signal routing and communications between a first level and a second level in a molecular-wire crossbar. The molecular wire crossbar comprises a two-dimensional array of a plurality of nanometer-scale switches. However, if the CAM is to be embedded within, or will interface with, CMOS or other conventional, micron-scale circuitry, then an alternative approach is typically required to be used.

Figure 14:
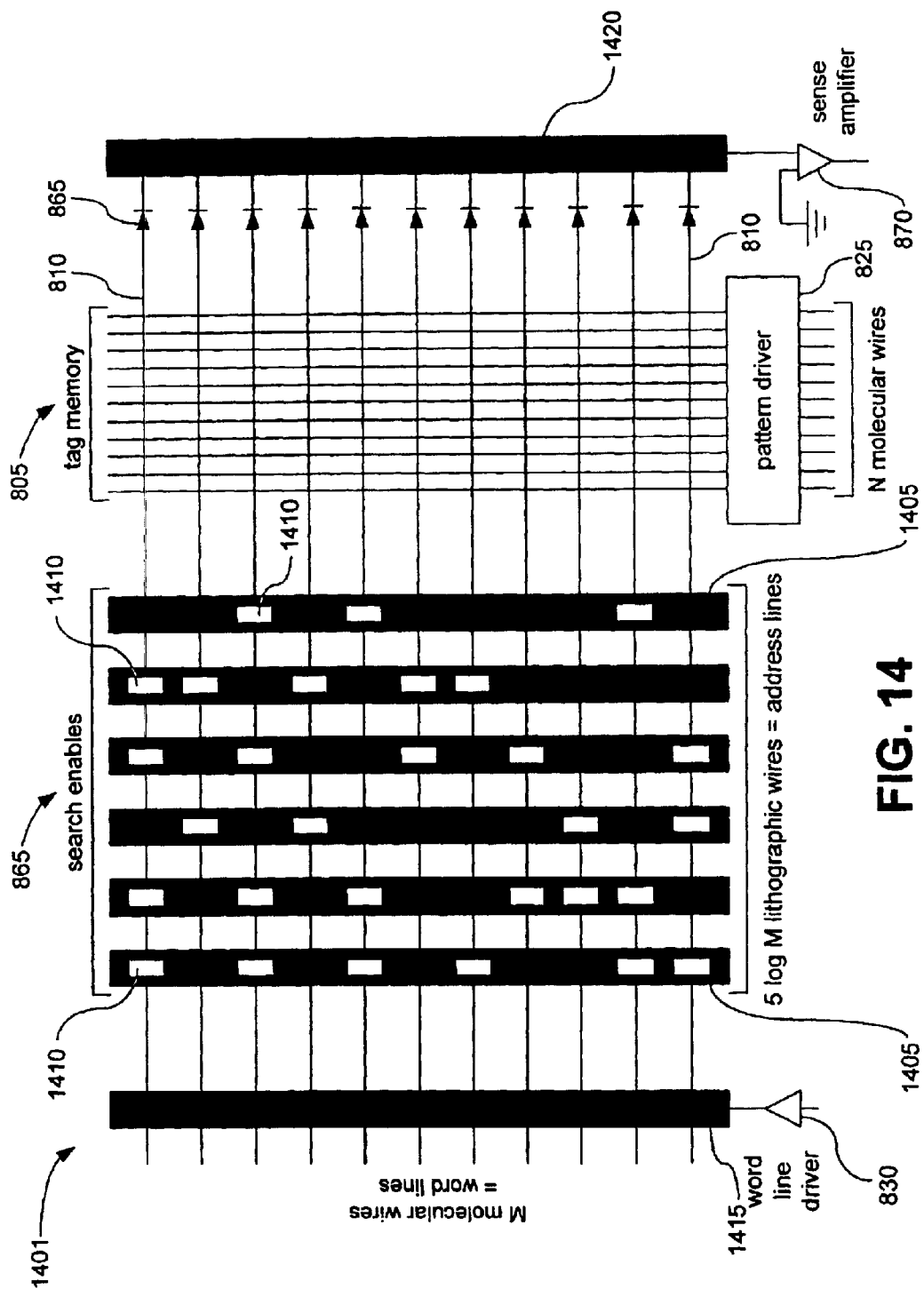
FIG. 14 is a block diagram illustrating a CAM having the interfacing address lines coupled to conventional, micron-scale circuitry, in accordance with an embodiment of the invention.

FIG. 14 is a block diagram of a CAM 1401 with interfacing address lines 810 coupled to conventional, micron-scale circuitry (in this example, replacing the pattern driver nano-scale wires), in accordance with an embodiment of the invention. FIG. 14 shows how the 2 ⌈log₂ M⌉ vertical molecular wires 840 in the search enable section (module) 865 (see FIG. 8) can be replaced with approximately K ⌈log₂ M⌉ vertical micron scale wires 1405 (where K is a small integer value greater than approximately four (4) and less than approximately ten (10). One example method that can be used to replace molecular wires with micron scale wires is disclosed in, for example, commonly-assigned U.S. Pat. No. 6,256,767. The example method in U.S. Pat. No. 6,256,767 or other suitable methods can be used to place the vertical micron scale wires 1405 in the search enable section 865 in FIG. 14. Additionally, in an embodiment of the invention, state 1 transistors (such as state 1 FETs 500 in FIG. 5) are randomly formed at the junctions of horizontal molecular wires 810 and the vertical micron scale wires 1405. In the example of FIG. 14, the state 1 transistors are shown as transistors 1410. Vertical micron scale wires 1405 are shown as 5 $\lceil \log_2 M \rceil$ lithographic wires that form the address lines in the search enable section 865. The increased number of search enable wires (by use of the vertical micron scale wires 1405) allows the horizontal molecular wires 810 to be either uniquely addressed or enabled.

A vertical micron scale wire 1415 also connects the word line driver 830 to the word lines 810 which are formed by the M molecular wires, while a vertical micron scale wire 1420 also connects the diodes 885 to the sense amplifier 870, in accordance with an embodiment of the invention.

Operation of the CAM

The address (or addresses) of a specific pattern in a CAM can be found using a binary search, in accordance with an embodiment of a method of the invention. For an M-word CAM holding a single instance of a particular value, finding the address containing that value can be found in $O(\log_2 M)$ steps, where each step involves setting a value in the address driver 835 and then examining the resulting sense amplifier 870 output.

Figure 15:
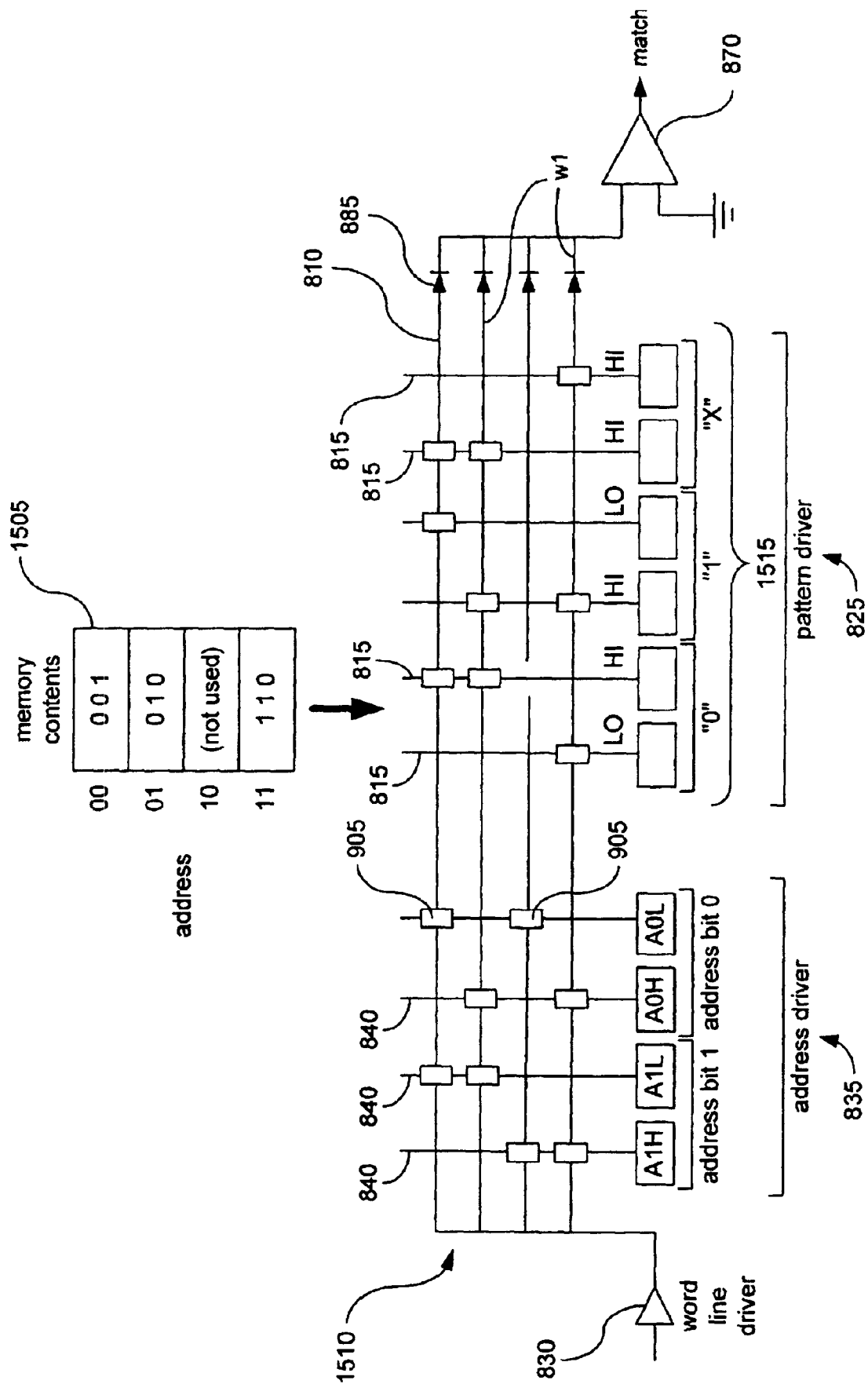
FIG. 15 is a block diagram illustrating a method of searching for an example pattern "01X" in a CAM, in accordance with an embodiment of the invention.

The operation of a CAM 1505, in an embodiment of the invention, is illustrated by the example shown in FIG. 15. A table (representing CAM 1505) at the top of FIG. 15 shows the logical content of the CAM 1505, while the circuit 1510 at the bottom of FIG. 15 shows an implementation of the CAM 1505. This example shows a 4-word CAM 1505, 3 bits wide, holding the data values 001, 010, and 110 at the addresses "00", "01", and "11", respectively. Note that one of the CAM locations is unused (address "10"). Assume that a search will be made for a pattern 1515 (such as "01X" as an example pattern) to determine an address or addresses in the CAM, if any, that contain a data value that matches the target pattern 1515.

To begin the search, the pattern driver 825 is loaded with the target pattern "01X" using the encoding of Table 1. Then the address space of the CAM 1505 is searched one bit at a time. To begin, the address "1X" might be loaded into the address driver 835 using the encoding of Table 2. This causes the address registers A1H, A0H, and A0L to drive the "HI" level, while register A1L drives the "LO" level. By tracing the circuit 1510 in FIG. 15, it is observed that in this configuration, no current will flow from the word driver 830 on the left side of circuit 1510 through the word lines 810 and diodes 885 to the sense amplifier 870 on the right side of the circuit 1510. This means that the desired pattern "01X" is not present in the upper half of the address space. If the desired pattern "01X" is present at all in the memory space of the CAM 1505, then it must be in the lower half of the address space.

Next, the lower half of the address space is searched by loading the address "00" into the address driver 835. This also produces no current flow and a "no match" signal from the sense amplifier 870, signifying that the desired pattern 1515 is not in the lower quadrant of the memory space and can only be in the second quadrant (address "01") if the desired pattern 1515 is present at all in the memory space of the CAM 1505. Finally, the address "01" is loaded into the address driver 835. This creates a low impedance path from the word line driver 830 on the left side of circuit 1510, through word line w1, since every transistor 905 on that word line w1 (and on no other word line 810) has been enabled by the vertical lines 840 from the address driver 835 and the vertical line 815 form the pattern driver 825. Thus, it may be deduced that the pattern "01X" is held in the CAM 1505 at address "01". Searching the CAM 1505 in this manner requires $O(\log_2 M)$ steps, providing increasing advantage over a sequential search as the value of M becomes larger. Note that word line w1 is also shown in FIG. 13.

The method described above for a specific example is described more generally in the pseudocode in Table 4. Note that the algorithm in Table 4 is recursive.

TABLE 4

```
binary search {
    load target pattern;
    addressPattern = xxx...xxx;
    list = empty;
    search (addressPattern, list);
    return list;
}
search (addressPattern, list) {
    if sense amplifier senses current {
        if addressPattern has no "X" bits {
            add addressPattern to list;
        } else {
            find most significant X bit, call it α
            search (addressPattern with α = 0, list);
            search (addressPattern with α = 1, list);
        }
    }
}
```

Alternate Search Strategy

When searching for a target pattern 1515 containing a few "X" bits (or no "X" bits) using the approach of the previous section, very little current flows through the word lines 810, since very few word lines 810 would have all transistors on the word lines 810 enabled. A target pattern 1515 containing a large number of "X" bits could potentially cause greater current flow due to the larger number of word lines 810 matching and enabling the current flow. If this is a concern, then this potential problem can be overcome at a cost of a slight increase in search time by performing a higher order search, in accordance with an embodiment of the invention. For example, instead of performing a binary search in accordance with the pseudocode of Table 4 (which examines up to half of the CAM at a time), an "octal" search can be performed where the octal search examines only one-eight of the CAM at a time or a higher order search could be performed. This higher order search method is described generally by the pseudocode in Table 5.

TABLE 5

```
binary search 2 {
    load target pattern;
    addressPattern = xxx...xxx;
    list = empty;
    search2 (addressPattern, list);
}
search2 (addressPattern, list) {
    if sense amplifier senses current output {
        if addressPattern has no "X" bits
            add addressPattern to list;
        } else {
            find N most significant X bits, call them β
            search (address Pattern with β = 0);
            search (address Pattern with β = 1);
            search (address Pattern with β = 2);
                    .
                    .
                    .
            search (address Pattern with β = 2^N −1);
        }
    }
}
```

Embodiments of the invention may offer at least one of the following possible advantages.

1. Nanoscale CAM: An embodiment of the invention implements a content addressable memory using molecular wire technology. No solutions to the problems solved by the invention have been published.

2. Logarithmic time lookup: Searching a large memory for a specific pattern can be performed in logarithmic time. Since molecular wire memories can be potentially very large, this search method provides a much faster search time than the search time required in a linear search of a conventional memory.

3. Defect tolerance: There is no requirement that any pair of vertical (or horizontal) molecular wires be adjacent to each other or have any other particular geometric or topological relationship. This means that defective horizontal or vertical wires can now simply be ignored, and the CAM implemented with particular defective horizontal and vertical wires may remain functional. A wire might be defective either due to breaks or short circuits in the wire, or the failure to form transistors at the junctions with other wires.

4. Low power: For searches involving few "don't care" bits in the search pattern, very few word lines are enabled to conduct current, thus keeping power consumption low during a search. For search patterns with a large number of "don't care" bits, power can still be kept low with a slight increase in search time by using a higher order search technique.

5. Density: Only two transistors are needed for each memory bit. Since the search enable circuitry scales logarithmically with the size of the CAM, the vast bulk of the molecular area is devoted to the actual memory of interest.

6. "Don't care" search bits: A search pattern may include "don't care" bits, which are useful in many search algorithms.

7. Variable width data values: Data values stored within the tag memory of a CAM may include "don't care" bits, which provide a simple mechanism for storing variable width data in a fixed width CAM.

8. "Unused" support: Unused entries in the CAM are easily encoded to prevent false matches in a partially filled CAM.

9. CMOS interfacing: Since the search enable circuitry need not be implemented using nanoscale wires and can instead be implemented using micron-scale wires, the CAM may be easily interfaced to conventional micron-scale CMOS circuitry or other circuitry.

Reference throughout this specification to "one embodiment", "an embodiment", or "a specific embodiment" means that a particular feature, structure, or characteristic described in connection with the embodiment is included in at least one embodiment of the present invention. Thus, the appearances of the phrases "in one embodiment", "in an embodiment", or "in a specific embodiment" in various places throughout this specification are not necessarily all referring to the same embodiment. Furthermore, the particular features, structures, or characteristics may be combined in any suitable manner in one or more embodiments.

Other variations and modifications of the above-described embodiments and methods are possible in light of the foregoing teaching.

Further, at least some of the components of an embodiment of the invention may be implemented by using a programmed general purpose digital computer, by using application specific integrated circuits, programmable logic devices, or field programmable gate arrays, or by using a network of interconnected components and circuits. Connections may be wired, wireless, by modem, and the like.

It will also be appreciated that one or more of the elements depicted in the drawings/figures can also be implemented in a more separated or integrated manner, or even removed or rendered as inoperable in certain cases, as is useful in accordance with a particular application.

It is also within the scope of the present invention to implement a program or code that can be stored in a machine-readable medium to permit a computer to perform at least one of the methods described above.

Additionally, the signal arrows in the drawings/Figures are considered as exemplary and are not limiting, unless otherwise specifically noted. Furthermore, the term "or" as used in this disclosure is generally intended to mean "and/or" unless otherwise indicated. Combinations of components or actions will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

It is also noted that the various functions, variables, or other parameters shown in the drawings and discussed in the text have been given particular names for purposes of identification. However, the function names, variable names, or other parameter names are only provided as some possible examples to identify the functions, variables, or other parameters. Other function names, variable names, or parameter names may be used to identify the functions, variables, or parameters shown in the drawings and discussed in the text.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A content addressable memory (CAM), comprising:
a word line driver configured to provide a driving signal;
a tag memory including M word lines traversing through the tag memory and intersecting with 2N bit lines, where M and N are each suitable integer values, where each word line and each bit line comprises a single molecular wire;
a search enable circuitry coupled to the word line driver and configured to allow the driving signal to be driven onto a subset of the word lines in the tag memory; and
a match detection circuit coupled to the tag memory and configured to detect current flow on the horizontal word lines.

2. The content addressable memory of claim 1, wherein the search enable circuitry includes 2 [$\log_2$ M] vertical address lines intersecting the word lines.

3. The content addressable memory of claim 2, wherein each of the vertical address lines in the search enable circuitry comprises a single molecular wire.

4. The content addressable memory of claim 2, wherein each of the vertical address lines in the search enable circuitry comprises a micron scale wire.

5. The content addressable memory of claim 4, wherein the number of micron scale wires is $K [\log_2 M]$, where K is a small integer value greater than approximately four (4) and less than approximately ten (10).

6. The content addressable memory of claim 4, wherein a transistor is randomly formed in at least some of the junctions of the word lines and the micron scale wires.

7. The content addressable memory of claim 2, wherein the search enable circuitry includes an address driver coupled to each of the vertical address lines.

8. The content addressable memory of 7, claim wherein the address driver comprises a plurality of address driver registers, each address driver register coupled to one of the vertical address lines.

9. The content addressable memory of claim 1, further comprising:

an address enable circuitry configured to represent the unused locations in the CAM.

10. The content addressable memory of claim 9, wherein the address enable circuitry includes a molecular wire crossing the word lines.

11. The content addressable memory of claim 9, wherein the address enable circuitry includes a micron scale wire crossing the word lines.

12. The content addressable memory of claim 1, wherein the tag memory includes a pattern driver coupled to the bit lines.

13. The content addressable memory of claim 12, wherein the pattern driver comprises a plurality of multibit registers, each multibit register coupled to one of the bit lines.

14. The content addressable memory of claim 1, wherein the match detection circuit comprises:

a plurality of diodes coupled to the word lines; and a sense amplifier coupled to the plurality of diodes.

15. The content addressable memory of claim 1, wherein the tag memory is configured to store data values including "don't care" bits to provide a mechanism for storing variable width data in a fixed width of the CAM.

16. The content addressable memory of claim 1, wherein a pair of junctions between a word line and a pair of bit lines in the tag memory encodes one of the bit values of "0," "1," and "X."

17. The content addressable memory of claim 1, wherein a pair of junctions between a word line and a pair of bit lines in the tag memory encodes a bit value of "U" which indicates an unused address.

18. A method of forming a content addressable memory (CAM), the method comprising:

providing a word line driver configured to provide a driving signal;

providing a tag memory including M word lines traversing through the tag memory and intersecting with 2N bit lines, where M and N are each suitable integer values, where each word line and each bit line comprises a single molecular wire;

providing a search enable circuitry coupled to the word line driver and configured to allow the driving signal to be driven onto a subset of the word lines in the tag memory; and providing a match detection circuit coupled to the tag memory and configured to detect current flow on the horizontal word lines.

19. The method claim 18, wherein the search enable circuitry includes $2 [\log_2 M]$ vertical address lines intersecting the word lines.

20. The method of claim 19, wherein each of the vertical address lines in the search enable circuitry comprises a single molecular wire.

21. The method of claim 19, wherein each of the vertical address lines in the search enable circuitry comprises a micron scale wire.

* * * * *